(12) United States Patent
Lee et al.

(10) Patent No.: US 7,295,047 B2
(45) Date of Patent: Nov. 13, 2007

(54) OUTPUT BUFFER WITH IMPROVED SLEW RATE AND METHOD THEREOF

(75) Inventors: Seung-Jung Lee, Seoul (KR); Do-Youn Kim, Hwaseong-si (KR); Chang-Hwe Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/319,232

(22) Filed: Dec. 28, 2005

(65) Prior Publication Data

US 2006/0170458 A1 Aug. 3, 2006

(30) Foreign Application Priority Data

Dec. 28, 2004 (KR) ............... 10-2004-0113923

(51) Int. Cl.
*H03B 1/00* (2006.01)

(52) U.S. Cl. ....................... 327/108; 327/112

(58) Field of Classification Search ........ 327/108–112, 327/306, 333, 530; 330/252–255; 326/62–63, 326/81–83, 85–87; 365/189.11
See application file for complete search history.

(56) References Cited

U.S. PATENT DOCUMENTS 6,066,985 A * 5/2000 Xu .............................. 330/253

6,727,753 B2 * 4/2004 Moon ......................... 330/253

FOREIGN PATENT DOCUMENTS

| JP | 08-298445 | 11/1996 |
|---|---|---|
| JP | 09-093111 | 4/1997 |
| JP | 09-093116 | 4/1997 |
| KR | 93-24479 | 11/1993 |
| KR | 1020040066546 | 7/2004 |

* cited by examiner

*Primary Examiner*—Linh My Nguyen
(74) *Attorney, Agent, or Firm*—Harness, Dickey & Pierce, P.L.C.

(57) ABSTRACT

An output buffer with an improved slew rate and method thereof. The output buffer may include a differential amplifier, a controller and an output unit. The output buffer may generate a pull signal and a control signal based on received input and output signals. The controller may transition an output node to a control voltage in response to the control signal and a bias voltage. The output unit may maintain the first output signal between a given voltage and the control voltage based on the pull signal and the bias voltage.

36 Claims, 9 Drawing Sheets

US 7,295,047 B2

OUTPUT BUFFER WITH IMPROVED SLEW RATE AND METHOD THEREOF

PRIORITY STATEMENT

This application claims the benefit of Korean Patent Application No. 10-2004-0113923, filed on Dec. 28, 2004, in the Korean Intellectual Property Office, the disclosure of which is incorporated herein in its entirety by reference.

BACKGROUND OF THE INVENTION

1. Field of the Invention

Example embodiments of the present invention relate generally to an output buffer and method thereof, and more particularly to an output buffer outputting an output signal with an improved slew rate and method thereof.

2. Description of the Related Art

A Liquid Crystal Display (LCD) may include a liquid crystal panel and a driving unit. The liquid crystal panel may include a lower glass substrate on which pixel electrodes and thin film transistors may be arranged in a matrix form, an upper glass substrate on which common electrodes and a color filter layer may be formed and a liquid crystal layer disposed between the lower and upper glass substrates.

The driving unit may include an image signal processor, a controller, a gate driver and a source driver. The image signal processor may process an image signal (e.g., received from an external source) and may output a complex synchronization signal. The controller may receive the complex synchronization signal from the image signal processor and may output a horizontal synchronization signal and a vertical synchronization signal. The controller may control a timing of the synchronization signals in accordance with a mode selection signal. The gate driver and the source driver may sequentially apply a driving voltage to scanning lines and signal lines of the liquid crystal panel in response to an output signal from the controller.

In conventional LCDs, offsets between channels of a source driver may influence characteristics of the LCD. The channel offsets of the source driver may be caused by output buffers which may be included in the source driver.

FIG. 1 is a block diagram of a conventional LCD 100. Referring to FIG. 1, the LCD 100 may include a liquid crystal panel 30 on which a plurality of pixels may be respectively disposed at intersections of a plurality of gate lines GL and a plurality of source lines SL, a source driver 20 which may output image signals to the respective pixels via the source lines SL of the liquid crystal panel 30 and a gate driver 10 which may select at least one of the plurality of gate lines GL of the liquid crystal panel 30 and may turn on corresponding pixels.

Each of the plurality of pixels may include a thin film transistor TR with a gate connected to one of the plurality of gate lines GL and a drain connected to one of the plurality of source lines SL, a storage capacitor Cs connected in parallel with the source of the thin film transistor TR and a liquid crystal capacitor Clc.

FIG. 2 is a block diagram of the source driver 20 of FIG. 1. The source driver 20 of FIG. 2 may include a shift register 40, a latch 50, a data latch 60, a digital-to-analog (D/A) converter 70 and an output buffer 80.

If digital R, G, B (e.g., red, green and blue, respectively) data is received by the source driver 20, pixel information in the digital R, G, B data may be sampled for each column line by the latch 50 and may be stored in the latch 50 in response to a latch enable signal (not shown) output from the shift register 40. The data latch 60 may receive and store the digital R, G, B data sampled by the latch 50 in response to a clock signal. The D/A converter 70 may convert the digital R, G, B data stored in the data latch 60 into analog R, G, B data and may output the analog R, G, B data to the output buffer 80. The output buffer 80 may amplify a signal corresponding to the analog R, G, B data and may output the amplified signal to a corresponding source line SL of the liquid crystal panel 30 of FIG. 1.

The conventional output buffer 80 may use a supply voltage VDD as a driving voltage and the output signal of the output buffer 80 may be inverted (e.g., from positive to negative, from negative to positive, etc.) for each horizontal period, based on a common voltage Vcom, where the common voltage Vcom may equal half of the supply voltage VDD.

Channel offsets may be generated by a voltage follower amplifier (not shown) included in the output buffer 80, which may thereby cause a voltage deviation in the output signal of output buffer 80. The voltage deviation of the output signal may cause picture quality deterioration, such as stripe patterns on a screen of the liquid crystal panel 30.

In order to reduce the voltage deviation of the output signal, a chopping method may be employed. The chopping method may include dividing a voltage follower amplifier into a first part for controlling a higher voltage portion of the output signal and a second part for controlling a lower voltage portion of the output signal. By handling the higher and lower voltage portions separately with the chopping method, a size of a circuit may be reduced as compared with using a voltage follower amplifier with a rail-to-rail structure. The chopping method may decrease a slew rate of the output signal, where the slew rate may refer to a rate of which the output signal may follow an input signal. Higher slew rates may reduce response times of the LCD.

FIG. 3 is a circuit diagram of a higher voltage portion of a conventional voltage follower output buffer 300. Referring to FIG. 3, the voltage follower output buffer 300 may include a differential amplifier 310 and an output portion 320. The operation of the voltage follower output buffer 300 shown in FIG. 3 is well known to those skilled in the art, and further description is omitted for the sake of brevity.

FIG. 4 is a graph illustrating an input signal 90 and an output signal 92 of the higher voltage portion of the voltage follower output buffer 300 of FIG. 3.

Referring to FIGS. 3 and 4, during a pull-up operation in which the input signal 90 may transition to a first logic level (e.g., a higher logic level), the slew rate of the output signal 92 may be higher (e.g., the waveform of the output signal 92 may approximate the waveform of the input signal 90). However, during a pull-down operation where the input signal 90 may transition to a second logic level (e.g., a lower logic level), a gate input of an NMOS transistor NTR connected to an output terminal OUTPUT may be fixed to a constant bias voltage BIAS1.

Accordingly, since the NMOS transistor NTR may be slightly turned on by the constant bias voltage BIAS1, the NMOS transistor NTR may not quickly discharge charges accumulated in a load capacitor of a liquid crystal panel (not shown) (e.g., liquid crystal panel 30) connected to the output terminal OUTPUT. Thus, when the input signal 90 transitions to the second logic level, the slew rate of the output signal 92 may decrease as illustrated in FIG. 4.

FIG. 5 is a circuit diagram of a lower voltage portion of a conventional voltage follower output buffer 500. Referring to FIG. 5, the voltage follower output buffer 500 may include a differential amplifier 510 and an output portion

520. The operation of the voltage follower output buffer 500 shown in FIG. 3 is well known to those skilled in the art, and further description is omitted for the sake of brevity.

FIG. 6 is a graph illustrating an input signal 94 and an output signal 96 of the lower voltage portion of the voltage follower output buffer 500 of FIG. 5.

Referring to FIGS. 5 and 6, during a pull-down operation in which the input signal 94 may transition to the second logic level (e.g., a lower logic level), the slew rate of the output signal 96 may be higher (e.g., the waveform of the output signal 96 may approximate the waveform of the input signal 94). However, during a pull-up operation where the input signal 94 may transition to the first logic level (e.g., a higher logic level), a gate input of an PMOS transistor PTR connected to an output terminal OUTPUT may be fixed to the constant bias voltage BIAS1, thereby decreasing the slew rate of the output signal 96 as illustrated in FIG. 6.

SUMMARY OF THE INVENTION

An example embodiment of the present invention is directed to an output buffer, including a first differential amplifier receiving a first input signal and a first output signal and generating a first pull signal and a control signal based on the differentially received signals, a first controller transitioning a first output node to a control voltage in response to the control signal and a first bias voltage and a first output unit maintaining the first output signal between a first voltage and the control voltage in response to the first pull signal and the first bias voltage.

Another example embodiment of the present invention is directed to a method of controlling slew rate, including receiving an input signal and an output signal, generating a pull signal and a control signal based on the received input and output signals, transitioning the output signal at an output node to a control voltage in response to the control signal and a bias voltage and maintaining the output signal between an input voltage and the control voltage based on the pull signal and the bias voltage.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
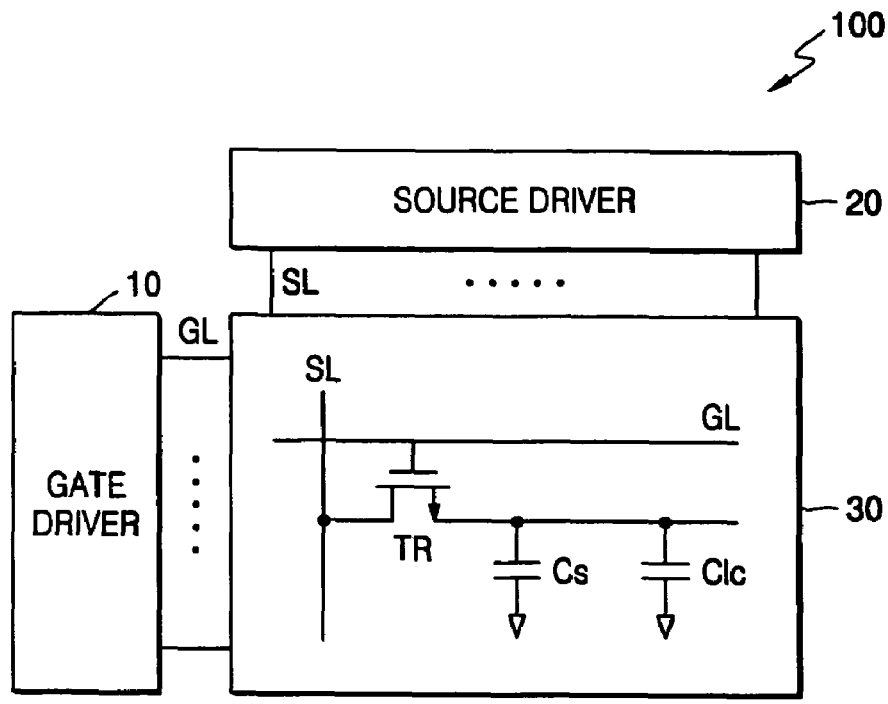
FIG. 1 is a block diagram of a conventional liquid crystal display (LCD).
Figure 2:
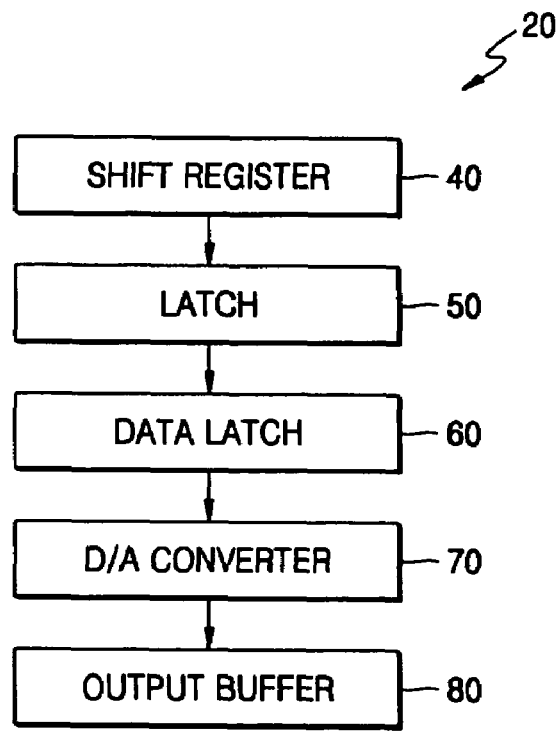
FIG. 2 is a block diagram of a source driver included in the conventional LCD of FIG. 1.
Figure 3:
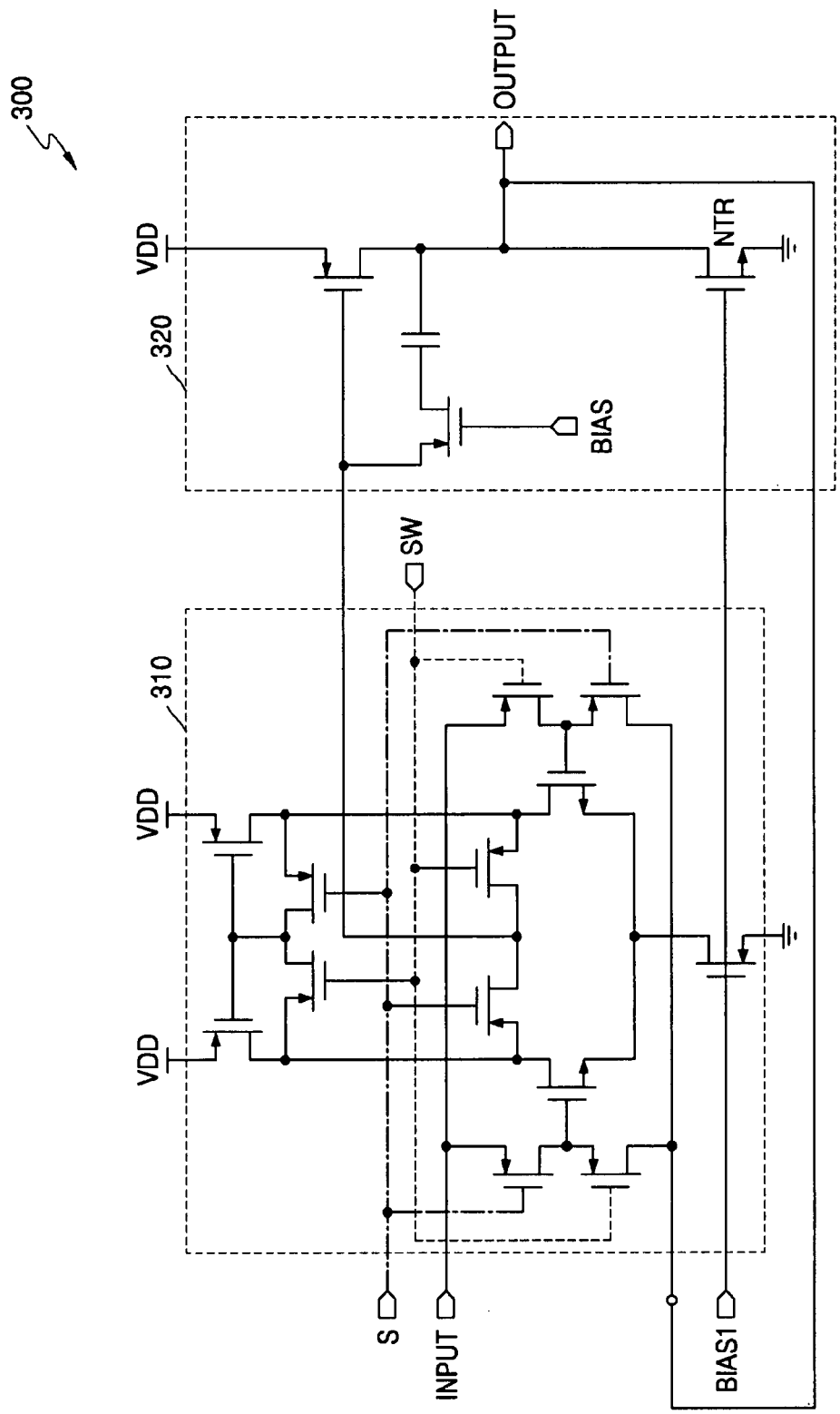
FIG. 3 is a circuit diagram of a higher voltage portion of a conventional voltage follower output buffer.
Figure 4:
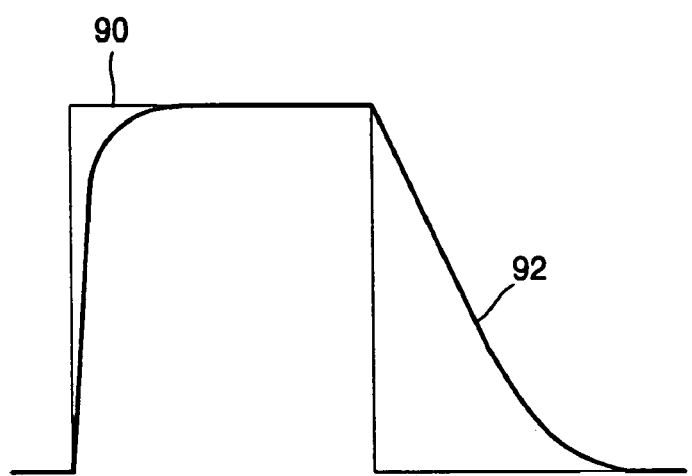
FIG. 4 is a graph illustrating an input signal and an output signal of the conventional voltage follower output buffer of FIG. 3.
Figure 5:
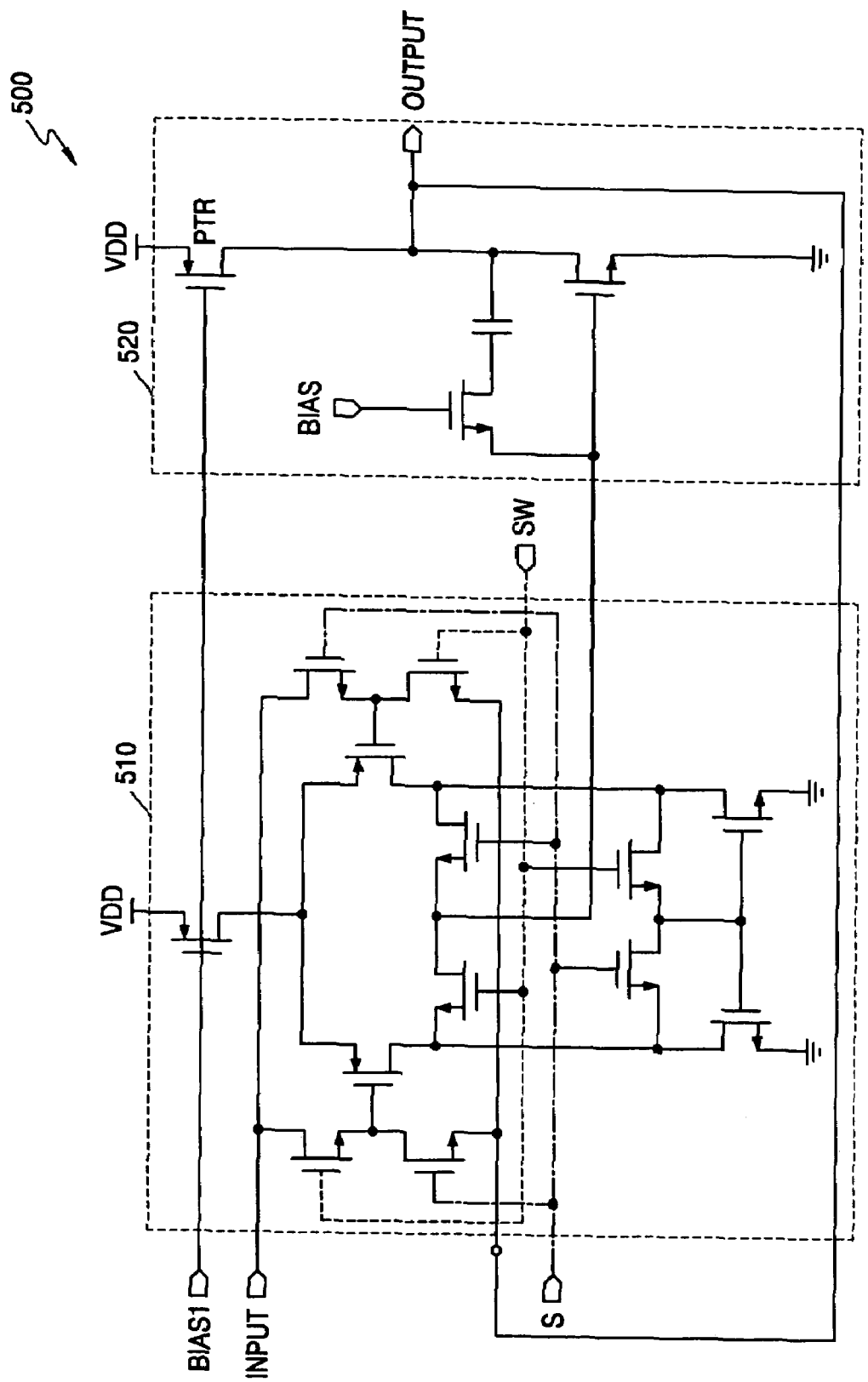
FIG. 5 is a circuit diagram of a lower voltage portion of a conventional voltage follower output buffer.
Figure 6:
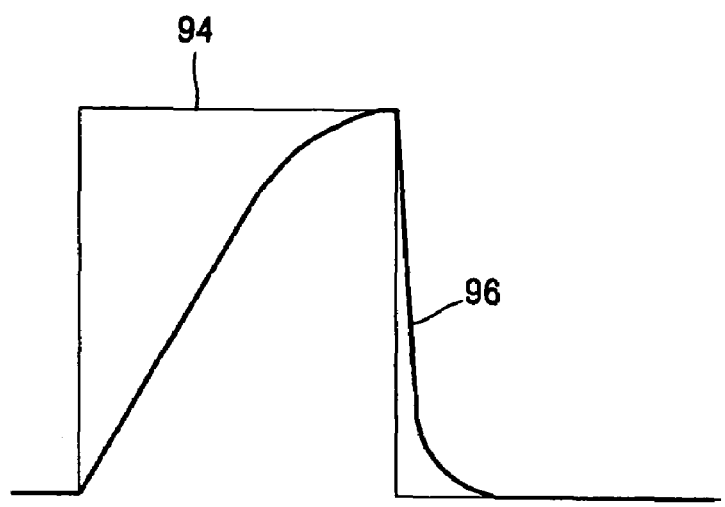
FIG. 6 is a graph illustrating an input signal and an output signal of the conventional voltage follower output buffer of FIG. 5.

Hereinafter, example embodiments of the present invention will be described in detail with reference to the accompanying drawings.

In the Figures, the same reference numerals are used to denote the same elements throughout the drawings.

Figure 7:
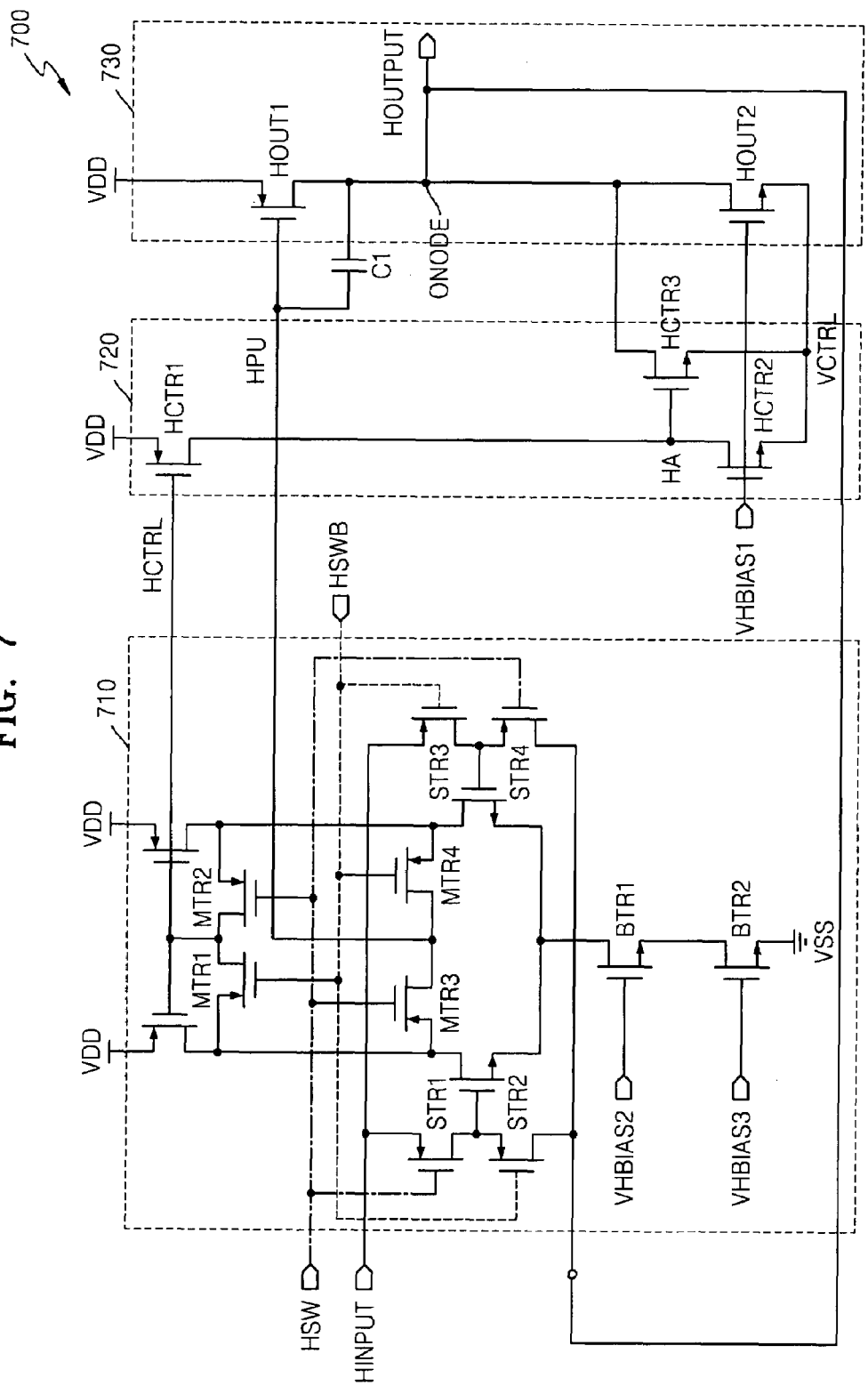
FIG. 7 is a circuit diagram of an output buffer according to an example embodiment of the present invention.

FIG. 7 is a circuit diagram of an output buffer 700 according to an example embodiment of the present invention.

In the example embodiment of FIG. 7, the output buffer 700 may be an output buffer for a higher voltage part based on a chopping method. The output buffer may include a differential amplifier 710, a controller 720 and an output unit 730.

In the example embodiment of FIG. 7, the differential amplifier 710 (e.g., a general differential amplifier) may differentially receive (e.g., receive and take a difference of) an input signal HINPUT and an output signal HOUTPUT in response to a switching signal HSW and an inverted signal HSWB of the switching signal HSW. The differential amplifier 710 may generate a pull-up signal HPU with an inverse logic level with respect to the input signal HINPUT and a control signal HCTRL with an inverse logic level with respect to the pull-up signal HPU.

In the example embodiment of FIG. 7, the controller 720 may set a voltage of an output node ONODE to a control voltage VCTRL in response to the control signal HCTRL and a first bias voltage VHBIAS1. In an example, the control voltage VCTRL may be half of a supply voltage VDD. The controller 720 may include a first transistor HCTR1, a second transistor HCTR2 and a third transistor HCTR3.

In the example embodiment of FIG. 7, the first transistor HCTR1 may include a first terminal receiving the supply voltage VDD, a gate receiving the control voltage and a second terminal connected to a first node HA. The second transistor HCTR2 may include a first terminal connected to the first node HA, a gate receiving the first bias voltage VHBIAS1 and a second terminal receiving the control voltage VCTRL. The third transistor HCTR3 may include a first terminal receiving the control voltage VCTRL, a gate connected to the first node HA, and a second terminal connected to the output node ONODE to control a voltage of the output node ONODE.

In the example embodiment of FIG. 7, if the input signal HINPUT is set to the second logic level (e.g., a lower logic level), the third transistor HCTR3 may be turned on to set a voltage of the output node ONODE to the control voltage VCTRL. The input signal HINPUT may be within a voltage range between the supply voltage VDD and the control voltage VCTRL (e.g., half of the supply voltage VDD).

In the example embodiment of FIG. 7, the output unit 730 may maintain an output signal HOUTPUT output from the output node ONODE between the supply voltage VDD and the control voltage VCTRL, in response to the pull-up signal HPU and the first bias voltage VHBIAS1.

In the example embodiment of FIG. 7, the output unit 730 may include a first output transistor HOUT1 and a second output transistor HOUT2. The output unit 730 may further include a stabilization capacitor C1. The first output transistor HOUT1 may include a first terminal connected to the supply voltage VDD, a gate receiving the pull-up signal HPU and a second terminal connected to the output node ONODE. The second output transistor HOUT2 may include a first terminal connected to the output node ONODE, a gate receiving the first bias voltage VHBIAS1 and a second terminal receiving the control voltage VCTRL.

In the example embodiment of FIG. 7, the output unit 730 may further include a stabilization capacitor C1 connected between the gate and drain of the first output transistor HOUT1 to stabilize an output signal HOUTPUT.

Hereinafter, an example operation of the output buffer 700 of FIG. 7 will be described according to another example embodiment of the present invention.

In example operation of the output buffer 700 of FIG. 7, the differential amplifier 710 may operate if bias transistors BTR1 and BTR2 are turned on in response to bias voltages VHBIAS2 and VHBIAS3. If a switching signal HSW is set to the first logic level (e.g., a higher logic level), switch transistors STR1 and STR4 may be turned off, switch transistors STR2 and STR3 may be turned on, mirror transistors MTR2 and MTR3 may be turned off and mirror transistors MTR1 and MTR4 may be turned on. If the input signal HINPUT transitions to the first logic level (e.g., a higher logic level), the pull-up signal HPU may transition to the second logic level (e.g., a lower logic level) by a differential amplification operation, thereby turning on the first output transistor HOUT1 and generating a control signal HCTRL at the first logic level (e.g., a higher logic level). Accordingly, an output signal HOUTPUT may transition to the first logic level when the first output transistor HOUT1 may be turned on. The first transistor HCTR1 may be turned off when the control signal HCTRL transitions to the first logic level, and the first node HA may transition to the second logic level (e.g., a lower logic level) when the second transistor HCTR2 may be slightly turned on by the first bias voltage VHBIAS1. The third transistor HCTR3 may thereby be turned off. When the output signal HOUTPUT increases (e.g., to the first logic level) and the pull up signal HPU applied to the gate of the first output transistor HOUT1 is set to the second logic level (e.g., a lower logic level), the first output transistor HOUT1 may be turned on, which may thereby drive loads of a LCD panel (not shown) (e.g., a thin film transistor (TFT) LCD panel) connected to the output node ONODE.

In example operation of the output buffer 700 of FIG. 7, if the input signal HINPUT transitions to the second logic level (e.g., a lower logic level), the pull-up signal HPU may transition to the first logic level (e.g., a higher logic level) by a differential amplification operation and the control signal HCTRL may transition to the second logic level (e.g., a lower logic level). The first transistor HCTR1 may be turned on when the control signal HCTRL is set to the second logic level (e.g., a lower logic level), such that the supply voltage VDD may be output and the first node HA may transition to the first logic level (e.g., a higher logic level). The first output transistor HOUT1 may be turned off by the pull-up signal HPU set to the first logic level (e.g., a higher logic level) and the second output transistor HOUT2 may be turned on by the first bias voltage VHBIAS1, such that the output signal HOUTPUT may transition to the second logic level (e.g., a lower logic level). When the output signal HOUTPUT decreases (e.g., to the second logic level), the second transistor HCTR2 may conduct a given current in response to the first bias voltage VHBIAS1 applied to its gate, thereby acting as a current load of the first transistor HCTRL1. The voltage at the first node HA may increase (e.g., to the first logic level) due to the operation of the first transistor HCTR1, and the third transistor HCTR3 may thereby be turned on.

In example operation of the output buffer 700 of FIG. 7, since the output unit 730 may be controlled by the third transistor HCTR3 and the third transistor HCTR3 may be capable of more quickly lowering the voltage of the output node ONODE and/or the second output transistor HOUT2, a slew rate of an output signal HOUTPUT of the output unit 730 may thereby be improved (e.g., increased). Further, when the output signal OUTPUT decreases (e.g., to the second logic level), by setting an operating voltage range of the second output transistor HOUT2 between the supply voltage VDD and the control voltage VCTRL (e.g., half of the supply voltage VDD) instead of between the supply voltage VDD and a ground voltage VSS, a gate voltage of the second output transistor HOUT2 may not be fixed to the first bias voltage VHBIAS1, and accordingly, the operation of the second output transistor HOUT2 may be controlled by at least one of the first, second, and third transistors HCTR1, HCTR2, and HCTR3, such that the slew rate of the output signal HOUTPUT may be improved (e.g., increased).

Figure 8:
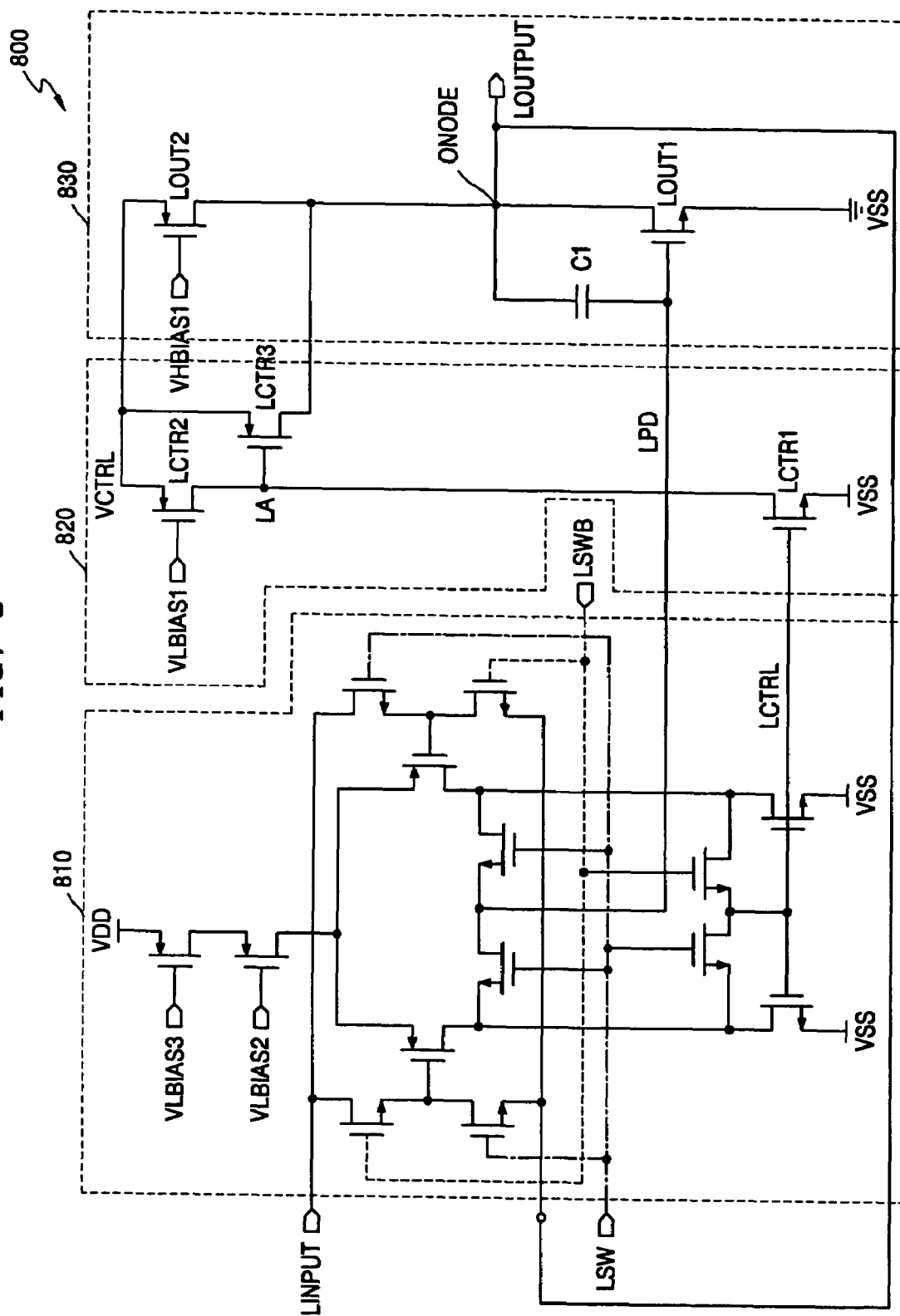
FIG. 8 is a circuit diagram of another output buffer according to another example embodiment of the present invention.

FIG. 8 is a circuit diagram of an output buffer 800 according to another example embodiment of the present invention. In an example, the output buffer 800 of FIG. 8 may be used in conjunction with the output buffer 700 of FIG. 7 in accordance with a chopping method, with each respective output buffer 700/800 handling a different portion (e.g., a higher voltage portion, a lower voltage portion, etc.) of an output voltage.

In the example embodiment of FIG. 8, the output buffer 800 may be an output buffer for lower voltage part based on a chopping method. The output buffer 800 may include a differential amplifier 810, a controller 820 and an output unit 830.

In the example embodiment of FIG. 8, the differential amplifier 810 (e.g., a general differential amplifier) may differentially receive (e.g., receive and take a difference of) an input signal LINPUT and an output signal LOUTPUT in response to a switching signal LSW and an inverted signal LSWB of the switching signal LSW. The differential amplifier 810 may generate a pull-down signal LPD with an inverse logic level with respect to the input signal LINPUT and a control signal LCTRL with an inverse logic level with respect to the pull up signal LPD.

The controller 820 may set a voltage of an output node ONODE to a control voltage VCTRL (e.g., half of the supply voltage VDD) in response to the control signal LCTRL and a first bias voltage VLBIAS1. The controller 820 may include first through third transistors LCTR1, LCTR2, and LCTR3, respectively.

In the example embodiment of FIG. 8, the first transistor LCTR1 may include a first terminal connected to a ground voltage VSS, a gate receiving the control signal LCTRL and a second terminal connected to a first node LA. The second transistor LCTR2 may include a first terminal receiving the control voltage VCTRL, a gate receiving the first bias voltage VLBIAS1 and a second terminal connected to the first node LA. The third transistor LCTR3 may include a first terminal receiving the control voltage VCTRL, a gate connected to the first node LA and a second terminal connected to the output node ONODE to control a voltage of the output node ONODE. If an input signal LINPUT is set to the first logic level (e.g., a higher logic level), the third transistor LCTRL3 may be turned on to set a voltage of the output node ONODE to the control voltage VCTRL (e.g., half of the supply voltage VDD).

In the example embodiment of FIG. 8, the output unit 830 may maintain an output signal LOUTPUT output from the output node ONODE between the ground voltage VSS and the control voltage VCTRL (e.g., half of the supply voltage VDD) in response to the pull down signal LPD and the first bias voltage VLBIAS1. In an example, the control voltage VCTRL may be half of the supply voltage VDD.

In the example embodiment of FIG. 8, the output unit 830 may include first and second output transistors LOUT1 and LOUT2. The output transistor LOUT1 may include a first terminal connected to the ground voltage VSS, a gate receiving the pull-down signal LPD and a second terminal connected to the output node ONODE. The second output transistor LOUT2 may include a first terminal connected to the output node ONODE, a gate receiving the first bias voltage VLBIAS1 and a second terminal receiving the control voltage VCTRL. The input signal LINPUT may be set within a voltage range between the ground voltage VSS and the control voltage VCTRL (e.g., half of the supply voltage VDD). The output unit 830 may further include a stabilization capacitor C2 connected between the gate and drain of the second output transistor LOUT2 to stabilize the output signal HOUTPUT.

Hereinafter, an example operation of the output buffer 800 of FIG. 8 will be described according to another example embodiment of the present invention.

In example operation of the output buffer 800 of FIG. 8, if an input signal LINPUT is set to the second logic level (e.g., a lower logic level), a pull-down signal LPD may transition to the first logic level (e.g., a higher logic level) by a differential amplification operation to turn on the first output transistor LOUT1. The differential amplifier 810 of FIG. 8 may operate in a manner similar to the differential amplifier 710 of FIG. 7, and, therefore, further description of the differential amplifier 810 has been omitted for the sake of brevity.

In example operation of the output buffer 800 of FIG. 8, an output signal LOUTPUT may transition to the second logic level (e.g., a lower logic level) when the first output transistor LOUT1 may be turned on. When the output signal LOUTPUT decreases (e.g., to the second logic level) and a pull-down signal LPD applied to the gate of the first output transistor LOUT1 is set to the first logic level (e.g., a higher logic level), the first output transistor LOUT1 may be turned on, which may thereby drive loads of a TFT LCD panel (not shown) connected to the output node ONODE.

In example operation of the output buffer 800 of FIG. 8, if the input signal LINPUT transitions to the first logic level (e.g., a higher logic level), the pull-down signal LPD may transition to the second logic level (e.g., a lower logic level) by a differential amplification operation and a control signal LCTRL1 may transition to the first logic level (e.g., a higher logic level). The first transistor LCTR1 may be turned on when the control signal LCTRL1 transitions to the first logic level (e.g., a higher logic level) such that the voltage of the first node LA may transition to the second logic level (e.g., a lower logic level). The first output transistor LOUT1 may be turned off when the pull-down signal LPD transitions to the second logic level and the second output transistor LOUT2 may be turned on by a first bias voltage VLBIAS1 such that the output signal LOUTPUT may transition to the first logic level. When the output signal LOUTPUT decreases (e.g., to the second logic level), the second transistor LCTR2 may receive a current from the first bias voltage VLBIAS1 applied to its gate, thereby acting as a current load of the first transistor LCTR1.

In the example operation of the output buffer 800 of FIG. 8, since the output unit 830 may be controlled by the third transistor LCTR3 and the third transistor LCTR3 may be capable of quickly lowering the voltage of the output node ONODE and/or the second output transistor LOUT2, a slew rate of an output signal LOUTPUT may be improved (e.g., increased) as the output signal HOUTPUT increases. When the output signal OUTPUT increases, by setting an operation voltage range of the second output transistor LOUT2 between the control voltage VCTRL and the ground voltage VSS instead of between the supply voltage VDD and the ground voltage VSS, a gate voltage of the second output transistor LOUT2 may not be fixed to the first bias voltage VLBIAS1 and the operation of the second output transistor LOUT2 may be controlled by at least one of the first, second and third transistors LCTR1, LCTR2, and LCTR3, respectively, such that the slew rate of the output signal LOUTPUT may be improved (e.g., increased).

Figure 9A:
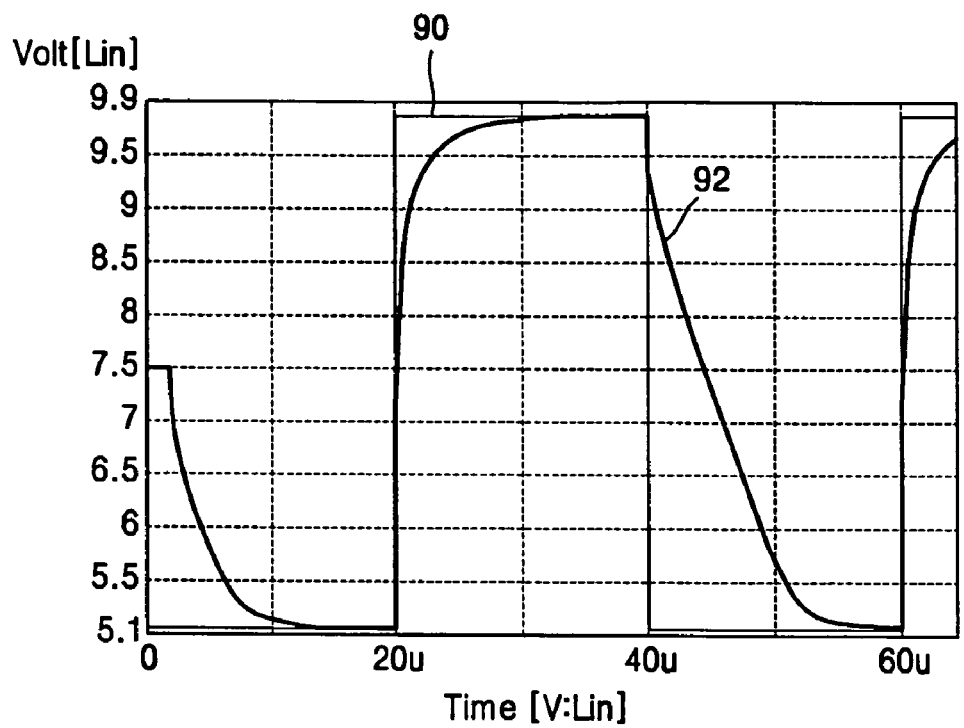
FIGS. 9A and 9B are graphs illustrating slew rates of the conventional output buffers of FIGS. 3 and 5, respectively.
Figure 9B:
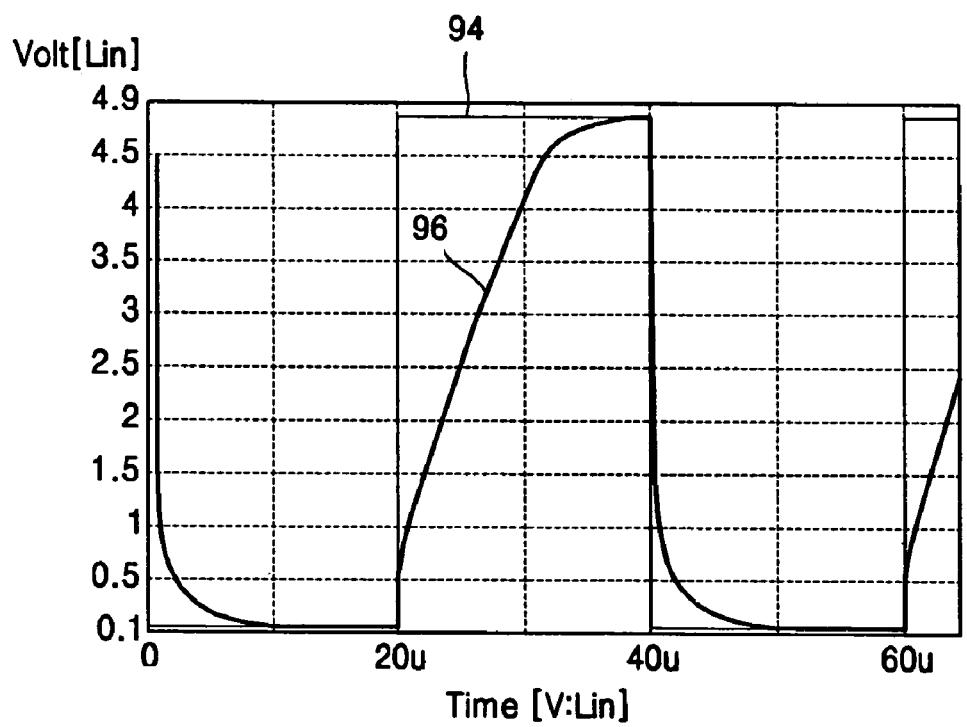

FIGS. 9A and 9B are graphs illustrating slew rates of the conventional output buffers 300 and 500, respectively. Referring to FIG. 9A, in the conventional output buffer 300, the slew rate of the output signal 92 as the input signal 90 decreases may be lower than that of the output signal 92 when the input signal 90 increases. Referring to FIG. 9B, in the conventional output buffer 500, the slew rate of the output signal 96 as the input signal 94 increases may be lower than that of the output signal 96 as the input signal 94 decreases.

Figure 10A:
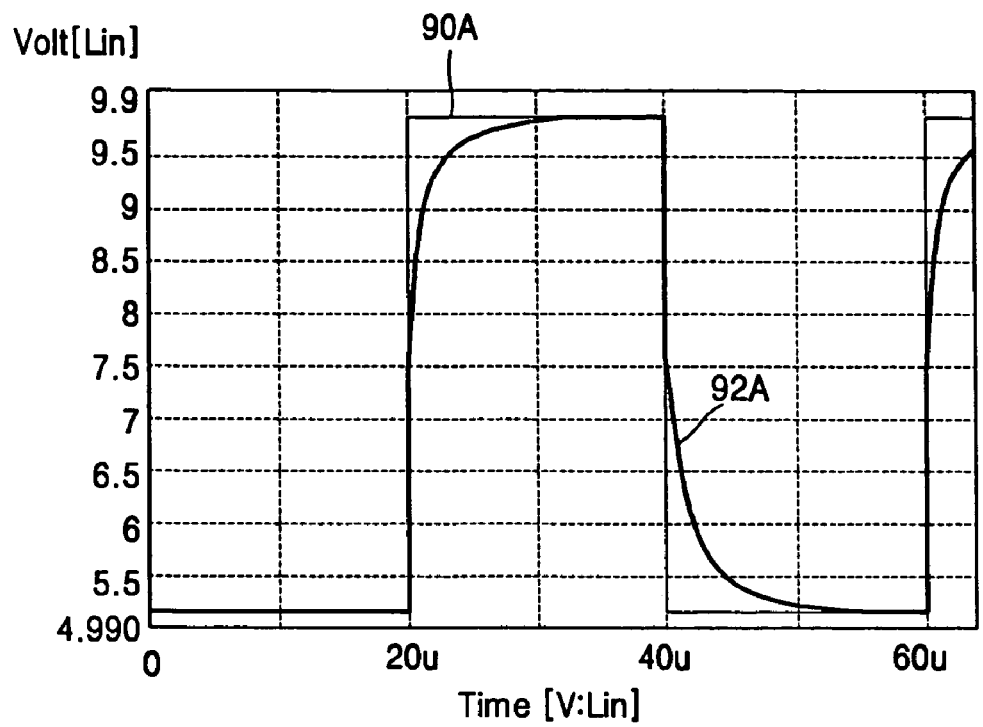
FIG. 10A is a graph illustrating a slew rate of the output buffer of FIG. 7 according to another example embodiment of the present invention.
Figure 10B:
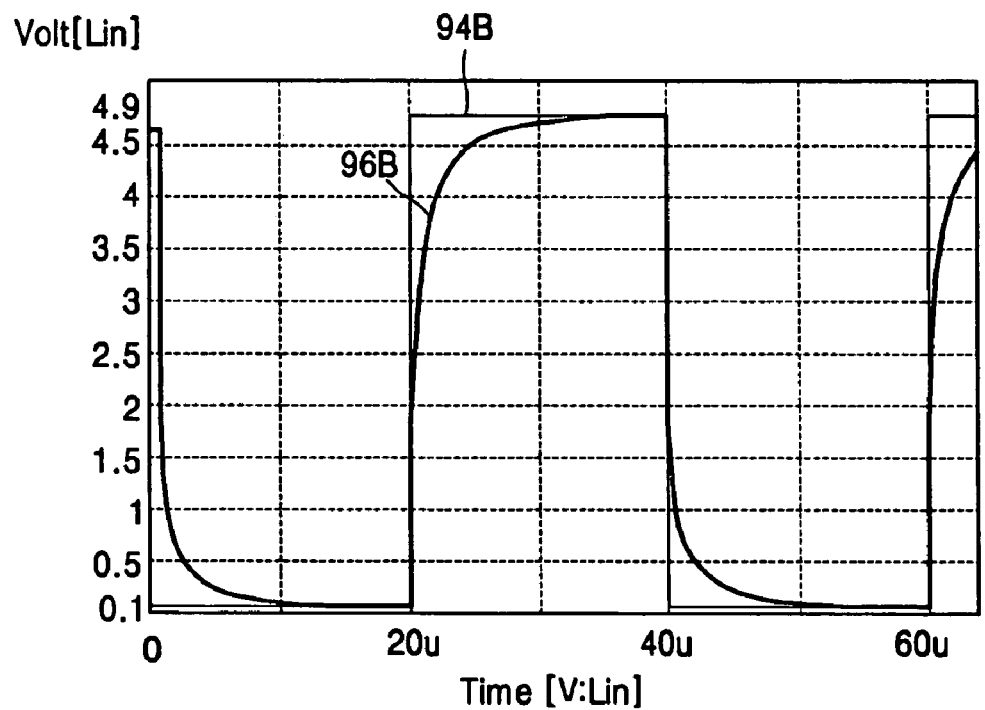
FIG. 10B is a graph illustrating a slew rate of the output buffer of FIG. 8 according to another example embodiment of the present invention.

FIG. 10A is a graph illustrating a slew rate of the output buffer 700 of FIG. 7 according to another example embodiment of the present invention. FIG. 10B is a graph illustrating a slew rate of the output buffer 800 of FIG. 8 according to another example embodiment of the present invention.

In the example embodiment of FIG. 10A, the slew rate of an output signal 92A as an input signal 90A decreases may be improved (e.g., increased) as compared with that of the conventional output signal 92 of FIG. 9A.

In the example embodiment of FIG. 10B, the slew rate of an output signal 96B as an input signal 94B rises may be improved (e.g., increased) as compared with that of the conventional output signal 96 of FIG. 9B.

In another example embodiment of the present invention, an output buffer may include first and second differential amplifiers, first and second controllers and first and second output units. In an example, the first differential amplifier, the first controller, and the first output unit may be configured as the differential amplifier 710, the controller 720 and the output unit 730, respectively, described above with respect to FIG. 7.

In another example embodiment of the present invention, an output buffer may output an output signal with an improved (e.g., higher) slew rate in a source driver of a device (e.g., a Liquid Crystal Display (LCD)) by controlling a voltage of an output node with a controller which may improve the driving capability of an output unit, thereby improving the slew rate of the output signal and reducing power consumption of the device.

Example embodiments of the present invention being thus described, it will be obvious that the same may be varied in many ways. For example, it is understood that the above-described first and second voltage levels may correspond to a higher logic or voltage level (e.g., logic "1") and a lower logic or voltage level (e.g., logic "0"), respectively, in an example embodiment of the present invention. Alternatively, the first and second voltage levels may correspond to the lower logic or voltage level (e.g., logic "0") and the higher logic or voltage level (e.g., logic "1"), respectively, in other example embodiments of the present invention.

Further, while above-described example embodiments of the present invention may be described as having a particular number of differential amplifiers, controllers and/or output units, it is understood that other example embodiments of the present invention may include any number of differential amplifiers, controllers and/or output units.

Such variations are not to be regarded as departure from the spirit and scope of example embodiments of the present invention, and all such modifications as would be obvious to one skilled in the art are intended to be included within the scope of the following claims.

What is claimed is:

1. An output buffer, comprising:
   a first differential amplifier receiving a first input signal and a first output signal and generating a first pull signal and a control signal based on the differentially received signals;
   a first controller transitioning a first output node to a control voltage in response to the control signal and a first bias voltage, the control voltage being greater than a ground voltage; and
   a first output unit maintaining the first output signal between a first voltage and the control voltage in response to the first pull signal and the first bias voltage.

2. The output buffer of claim 1, wherein the first pull signal is a pull-up signal.

3. The output buffer of claim 2, wherein the first controller is activated based on the first input signal being below a threshold voltage.

4. The output buffer of claim 2, wherein the first voltage is a supply voltage.

5. The output buffer of claim 4, wherein the control voltage is half of the supply voltage.

6. The output buffer of claim 1, wherein the first controller includes
   a first transistor having a first terminal connected to the first voltage, a first gate receiving the control signal and a second terminal connected to a first node,
   a second transistor having a third terminal connected to the first node, a second gate receiving the first bias voltage and a fourth terminal receiving the control voltage, and
   a third transistor having a fifth terminal receiving the control voltage, a third gate connected to the first node and a sixth terminal connected to the output node.

7. The output buffer of claim 6, wherein, the third transistor is turned on based on the first input signal and sets the first output node to the control voltage.

8. The output buffer of claim 6, wherein the third transistor is turned on in response to the first input signal dropping below a threshold voltage.

9. The output buffer of claim 1, wherein the first output unit includes
   a first output transistor having a first terminal connected to the first voltage, a first gate receiving the first pull signal and a second terminal connected to the first output node, and
   a second output transistor having a third terminal connected to the first output node, a second gate receiving the first bias voltage and a fourth terminal receiving the control voltage.

10. The output buffer of claim 1, wherein the first output signal is maintained at a voltage level between the first voltage and the control voltage.

11. The output buffer of claim 1, wherein the first pull signal is a pull-down signal.

12. The output buffer of claim 11, wherein the first controller is activated in response to the first input signal rising above a threshold voltage.

13. The output buffer of claim 11, wherein the first voltage is a ground voltage.

14. The output buffer of claim 6, wherein the third transistor is turned on in response to the first input signal rising above a threshold voltage.

15. The output buffer of claim 1, further comprising:
   a second differential amplifier differentially receiving a second input signal and a second output signal and generating a second pull signal and a generating second control signal based on the second differentially received signals;
   a second controller setting a second output node to the control voltage in response to the second control signal and a second bias voltage; and
   a second output unit maintaining the second output signal output between a second voltage and the control voltage in response to the second pull signal and the second bias voltage.

16. The output buffer of claim 15, wherein the first pull signal is a pull-up signal and the second pull signal is a pull-down signal.

17. The output buffer of claim 15, wherein the first voltage is a supply voltage and the second voltage is a ground voltage.

18. The output buffer of claim 15, wherein the first controller is activated when the first input signal falls below a first threshold voltage and the second controller is activated when the second input signal rises above a second threshold voltage.

19. The output buffer of claim 15, wherein the control voltage is half of the first voltage.

20. The output buffer of claim 15, wherein the first controller includes
   a first transistor having a first terminal connected to the first voltage, a first gate receiving the first control signal and a second terminal connected to the first node,
   a second transistor having a third terminal connected to the first node, a second gate receiving the first bias voltage and a fourth terminal receiving the control voltage, and
   a third transistor having a fifth terminal receiving the control voltage, a third gate connected to the first node and a sixth terminal connected to the first output node.

21. The output buffer of claim 20, wherein the third transistor is turned on if the first input signal falls below a threshold voltage.

22. The output buffer of claim 15, wherein the first output unit includes
   a first output transistor having a first terminal connected to the first voltage, a first gate receiving the first pull signal and a second terminal connected to the first output node, and
   a second output transistor having a third terminal connected to the first output node, a second gate receiving the first bias voltage and a fourth terminal receiving the control voltage.

23. The output buffer of claim 15, wherein the second controller includes a first transistor having a first terminal connected to the second voltage, a first gate receiving the second control signal and a second terminal connected to a second node;

a second transistor having a third terminal receiving the control voltage, a second gate receiving the second bias voltage and a fourth terminal connected to the second node, and a third transistor having a fifth terminal receiving the control voltage, a third gate connected to the second node and a sixth terminal connected to the second output node.

24. The output buffer of claim 23, wherein the third transistor is turned on in response to the first input signal rising above a threshold voltage.

25. The output buffer of claim 15, wherein the second output unit includes a first output transistor having a first terminal connected to the second voltage, a first gate receiving the second pull signal and a second terminal connected to the second output node, and a second output transistor having a third terminal connected to the second output node, a second gate receiving the second bias voltage and a fourth terminal receiving the control voltage.

26. The output buffer of claim 15, wherein the first input signal is maintained between the first voltage and the control voltage and the second input signal is maintained between the second voltage and the control voltage.

27. A Liquid Crystal Display (LCD), comprising:
a liquid crystal panel with a source driver including the output buffer of claim 1.

28. A method of controlling slew rate, comprising:
receiving an input signal and an output signal;
generating a pull signal and a control signal based on the received input and output signals;
transitioning the output signal at an output node to a control voltage in response to the control signal and a bias voltage, the control voltage being greater than a ground voltage; and maintaining the output signal between an input voltage and the control voltage based on the pull signal and the bias voltage.

29. The method of claim 28, wherein the pull signal and the control signal are generated based at least in part on a voltage difference between the input signal and the output signal.

30. The method of claim 28, wherein the pull signal is one of a pull-up signal and a pull-down signal.

31. The method of claim 28, wherein the control voltage is equal to one half of a supply voltage.

32. The method of claim 28, wherein the input voltage is a ground voltage.

33. The method of claim 28, wherein the input voltage is a supply voltage.

34. An output buffer performing the method of claim 28.

35. The output buffer of claim 1, wherein the control voltage is half of the supply voltage.

36. The output buffer of claim 1, wherein the first output unit includes a first output transistor having a first terminal connected to the first voltage, a first gate receiving the first pull signal and a second terminal connected to the first output node, and a second output transistor having a third terminal connected to the first output node, a second gate receiving the first bias voltage and a fourth terminal receiving the control voltage.

* * * * *